United States Patent [19]

Ruhland

[11] 4,408,298
[45] Oct. 4, 1983

[54] PSEUDO RANDOM NUMBER GENERATOR APPARATUS

[75] Inventor: Kim Ruhland, Shillington, Pa.

[73] Assignee: RCA Corporation, New York, N.Y.

[21] Appl. No.: 277,982

[22] Filed: Jun. 26, 1981

[51] Int. Cl.³ .............................................. H03K 3/84
[52] U.S. Cl. ...................................... 364/717; 331/78
[58] Field of Search .......................... 364/717; 331/78;
178/22.15

[56] References Cited

U.S. PATENT DOCUMENTS

| | | | |
|---|---|---|---|
| 3,703,727 | 11/1972 | Knowlton | 364/717 |
| 3,746,847 | 7/1973 | Maritsas | 364/717 |
| 3,761,696 | 9/1973 | Russell | 364/717 |
| 3,790,768 | 2/1974 | Chevalier et al. | 364/717 |
| 3,946,215 | 3/1976 | May | 364/717 |
| 4,161,041 | 7/1979 | Butler et al. | 365/244 |
| 4,213,101 | 7/1980 | Policand et al. | 331/78 |
| 4,291,386 | 9/1981 | Bass | 364/717 |
| 4,355,366 | 10/1982 | Porter | 364/717 |

*Primary Examiner*—Gary Chin
*Attorney, Agent, or Firm*—J. S. Tripoli; R. L. Troike; R. E. Smiley

[57] ABSTRACT

A pseudo random number generator for generating a succession of numbers manifesting solely three values at random from two-bits.

5 Claims, 1 Drawing Figure

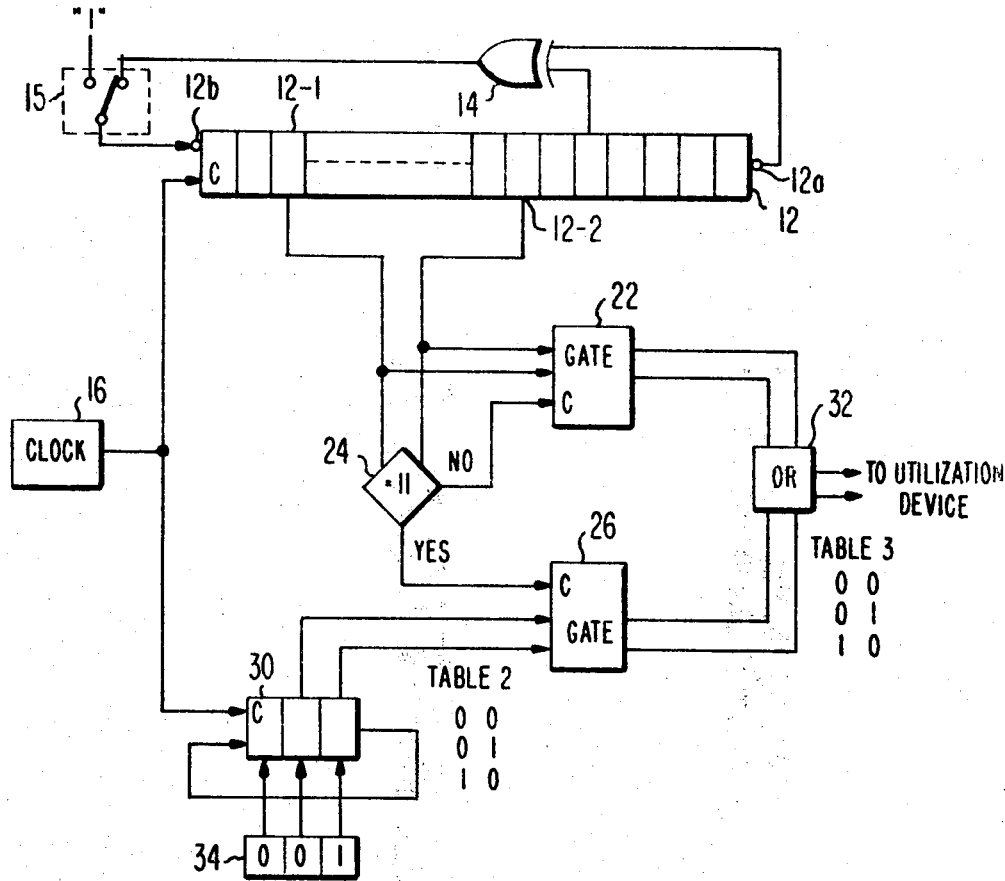

PSEUDO RANDOM NUMBER GENERATOR APPARATUS

The Government has rights in this invention pursuant to Contract No. DAAK20-80-C-0020 awarded by the Department of the Army.

BACKGROUND OF THE INVENTION

The present invention relates broadly to a psuedo random number generator, and in particular, to such a generator for generating three values in random order.

Digital apparatus is known for generating $2^N$ random numbers where N is an integer. Mathematical techniques are known for generating any number of random number values but such techniques involve multiplication and addition for the generation of each random number value. Such mathematical techniques are either slow or require costly special circuitry.

SUMMARY OF THE INVENTION

In accordance with the present invention, a random number generator for generating three numeric values in random order comprises first means for generating at a given rate, a succession of two-bit values for generating at random the three values and a fourth undesired value. A second means generates at the given rate in succession solely the three values. A third means is responsive to the generation of the fourth undesired value for substituting therefore the value then being generated by the second means.

BRIEF DESCRIPTION OF THE DRAWING

The sole drawing FIGURE is a pseudo random number generator for generating at random three values in accordance with the present invention.

DESCRIPTION OF THE PREFERRED EMBODIMENT

Referring now to the sole FIGURE, an n-bit shift register 12 has its output terminal 12a connected to one input of an exclusive OR gate 14. A second position of the shift register 12 arbitrarily chosen is also connected to a second input of exclusive-OR gate 14. Exclusive-OR gate 14 operates in accordance with truth table 1. The output of exclusive-OR gate 14 is connected via two position switch 15 to the input terminal 12b of shift register 12. A clock source 16 is coupled to the clock (C) input of shift register 12.

The arrangement of shift register 12 and exclusive-OR gate 14 acts as a pseudo random number generator generating $2^n - 1$ unique patterns once loaded with other than all 0 pattern. Switch 15 may be manually or automatically moved to load register 12 with all 1's. Thus, if two arbitrarily accessed positions such as 12-1 and 12-2 are arbitrarily chosen, a two-bit number will be generated that, in succession, will have at random the binary values 00, 01, 10 and 11. The two positions from shift register 12 are connected to a gate 22 and to a logic compare circuit 24. Logic compare circuit 24 has two outputs labeled respectively, NO and YES. The NO output is connected to the control terminal of gate 22 and the YES output is connected to the control terminal of a second similar gate 26. Clock 16 is connected to a three-bit position shift register 30. Two arbitrarily chosen output positions of that shift register are connected to gate 26. The outputs from gates 22 and 26 are connected through an OR gate 32 to a suitable utilization device, not shown. A preload circuit 34 is coupled to register 30 to load the register with desired bit values.

Operation of the pseudo random number generator of the sole FIGURE is as follows. Shift register 12 is preloaded with any combination of values except all 0's such as by momentarily moving switch 15 to load all 1's while clock 16 operates to clock the 1's into register 12. Shift register 30 is concurrently loaded from preload circuit 34 with a combination of values dependent on the particular value of the four values produced by shift register 12 which is not to be utilized. In the illustrated situation in which comparator 24 is set to detect the logic 1 and logic 1 combination, shift register 30 is loaded with two 0's and a 1 to insure that the two-bits which are coupled to gate 26 will never contain the values 1 and 1. In a situation in which comparator 24 is adapted to look for the logic 0 and logic 0 combination, shift register 30 is set with two ones and a zero such that the two-bit positions connected to gate 26 can never simultaneously contain the value 0.

With registers 12 and 30 loaded, under control of pulses from clock source 16, the bits in shift register 12 are shifted from input terminal 12b thereof through the various stages of the shift register in succession to the output terminal 12a and then to exclusive-OR gate 14. As indicated by Table 1 near exclusive-OR gate 14, it is responsive to identical valued inputs for producing a 0 output and to non-identical valued inputs for producing a 1 output. Thus, so long as shift register 12 is initialized to some values other than all 0's, exclusive-OR gate 14 will ultimately produce a string of 1's and 0's in a pseudo random fashion. Therefore, in response to successive clock pulses from source 16, shift register 12, positions 12-1 and 12-2, will each either be a 0 or a 1 and, therefore, the values applied to comparator 24 and to gate 22 will either be 0's or 1's. In the case which will occur three out of four times in which the values of locations 12-1 and 12-2 are other than both 1, comparator 24 produces a signal on its NO line which will prime gate 22 to pass the values then present in positions 12-1 and 12-2 (00, 01 or 10) through gate 22 and through OR gate 32 to a suitable utilization device. At the same rate at which data is being shifted through shift register 12, data in shift register 30 is also being shifted through the three positions thereof. Table 2 lists all of the possible outputs from shift register 30 which are applied to gate 26 in succession. During the times that the positions 12-1 and 12-2 are each producing a 1, comparator 24 produces a signal on its YES line to prime gate 26 to pass the value then being produced by the two outputs of shift register 30 to and through OR gate 32 to the utilization device. Table 3 lists the only possible outputs from OR gate 32. That is, the output from OR gate 32 will never be both 1's simultaneously.

What is claimed is:

1. A random number generator for generating three numeric values in random order, comprising in combination:

first means for generating at a given rate a succession of two-bit numbers for generating at random said three values and for also generating a fourth undesired value;

second means generating at said given rate in succession solely said three values; and third means responsive to the presence of said fourth undesired value for disabling the output of said fourth value by said first means and for enabling the output of said second means of the value then being generated by said second means.

2. The combination as set forth in claim 1 wherein said second means comprises a shift register.

3. The combination as set forth in either claim 1 or claim 2 wherein said third means comprises means for comparing the output from said first means against said fourth undesired value and for producing an output in accordance with the presence or absence of said fourth undesired value.

4. The combination as set forth in claim 3 wherein said third means further comprises two gate means, one coupled to receive signals from said first means and one coupled to receive signals from said second means and wherein the output from said comparator means determines which of said two gate means is enabled to pass data signals applied thereto.

5. The combination as set forth in claim 1 wherein said first means comprises a multi-bit shift register and an exclusive-OR gate responsive to any two of the multi-bits thereof for generating a bit value to be inserted into a preselected position in said shift register.

* * * * *